US009887194B2

(12) United States Patent
You et al.

(10) Patent No.: US 9,887,194 B2
(45) Date of Patent: Feb. 6, 2018

(54) SEMICONDUCTOR DEVICES AND METHODS OF FABRICATING THE SAME

(71) Applicant: Samsung Electronics Co., Ltd., Suwon-Si, Gyeonggi-do (KR)

(72) Inventors: Jung-Gun You, Ansan-si (KR); Sug-Hyun Sung, Yongin-si (KR); Se-Wan Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/989,876

(22) Filed: Jan. 7, 2016

(65) Prior Publication Data

US 2016/0204106 A1 Jul. 14, 2016

Related U.S. Application Data

(60) Provisional application No. 62/104,536, filed on Jan. 16, 2015.

(30) Foreign Application Priority Data

Jan. 13, 2015 (KR) ........................ 10-2015-0006135

(51) Int. Cl.
*H01L 27/088* (2006.01)
*H01L 29/06* (2006.01)
*H01L 29/423* (2006.01)
*H01L 21/8234* (2006.01)

(52) U.S. Cl.
CPC .. *H01L 27/0886* (2013.01); *H01L 21/823431* (2013.01); *H01L 21/823481* (2013.01); *H01L 29/0649* (2013.01); *H01L 29/0657* (2013.01); *H01L 29/42376* (2013.01)

(58) Field of Classification Search
CPC ............. H01L 27/0886; H01L 29/0649; H01L 29/0657; H01L 29/42376; H01L 21/823431; H01L 21/823481
USPC ........................................................ 257/401
See application file for complete search history.

(56) References Cited

U.S. PATENT DOCUMENTS

| 6,413,802 | B1 | 7/2002 | Hu et al. | |
|---|---|---|---|---|
| 8,853,015 | B1 | 10/2014 | Kuo et al. | |
| 2011/0193172 | A1* | 8/2011 | Juengling | H01L 27/10802 257/368 |
| 2012/0012932 | A1* | 1/2012 | Perng | H01L 29/165 257/347 |
| 2013/0277759 | A1 | 10/2013 | Chen et al. | |
| 2014/0027816 | A1* | 1/2014 | Cea | H01L 29/66545 257/192 |
| 2014/0106529 | A1 | 4/2014 | Morin et al. | |
| 2014/0167145 | A1* | 6/2014 | Ichinoseki | H01L 29/407 257/329 |
| 2014/0225197 | A1 | 8/2014 | Huang et al. | |

(Continued)

*Primary Examiner* — Vongsavanh Sengdara
(74) *Attorney, Agent, or Firm* — Ward and Smith, P.A.

(57) ABSTRACT

A semiconductor device and a method of fabricating the same are provided. The semiconductor device includes a fin which comprises long sides and a first short side, a first trench which is immediately adjacent the first short side of the fin and has a first depth, a second trench which is immediately adjacent the first trench and has a second depth greater than the first depth, a first protrusion structure which protrudes from a bottom of the first trench and extends side by side with the first short side, and a gate which is formed on the first protrusion structure to extend side by side with the first short side.

18 Claims, 22 Drawing Sheets

(56) References Cited

U.S. PATENT DOCUMENTS

| | | |
|---|---|---|
| 2014/0227857 A1 | 8/2014 | Youn et al. |
| 2014/0252428 A1* | 9/2014 | Chang .................. H01L 29/785 257/288 |
| 2014/0264575 A1 | 9/2014 | Tsai et al. |
| 2014/0264725 A1 | 9/2014 | Chuang |
| 2014/0273464 A1 | 9/2014 | Shieh et al. |
| 2014/0295647 A1 | 10/2014 | Cheng et al. |
| 2014/0312388 A1 | 10/2014 | Colinge |
| 2014/0327074 A1 | 11/2014 | Tsao |
| 2015/0144998 A1* | 5/2015 | Ching .................. H01L 29/785 257/190 |
| 2015/0243659 A1* | 8/2015 | Huang ................ H01L 27/0886 257/401 |

* cited by examiner

SEMICONDUCTOR DEVICES AND METHODS OF FABRICATING THE SAME

CROSS-REFERENCE TO RELATED APPLICATIONS

This application claims priority from Korean Patent Application No. 10-2015-0006135 filed on Jan. 13, 2015 in the Korean Intellectual Property Office and US provisional application No. 62/104,536 filed on Jan. 16, 2015 in the U.S. Patent and Trademark Office, and all the benefits accruing therefrom under 35 U.S.C. 119, the contents of which in its entirety are herein incorporated by reference.

BACKGROUND

As one of the scaling techniques for increasing the density of semiconductor devices, a multi-gate transistor has been suggested. The multi-gate transistor may be obtained by forming a fin- or nanowire-shaped silicon body on a substrate and forming gates on the surface of the silicon body.

The multi-gate transistor can be easily scaled because it uses a three-dimensional (3D) channel. In addition, the current control capability can be improved without the need to increase the gate length of the multi-gate transistor. Moreover, it is possible to effectively suppress a short channel effect (SCE) in which an electric potential of a channel region may be affected by a drain voltage.

SUMMARY

The present disclosure provides semiconductor devices which can minimize development load.

The present disclosure also provides methods of fabricating a semiconductor device which can minimize development load.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising a fin which comprises long sides and a first short side, a first trench that is immediately adjacent the first short side of the fin and has a first depth, a second trench that is immediately adjacent the first trench and has a second depth greater than the first depth, a first protrusion structure that protrudes from a bottom of the first trench and extends side by side with the first short side and a gate that is on the first protrusion structure to extend side by side with the first short side.

In some embodiments, the first short side and the second short side face each other.

In some embodiments, the first protrusion structure is located at a boundary between the first trench and the second trench, and the second protrusion structure is located at a boundary between the first trench and the third trench.

In some embodiments, the semiconductor device further includes a third gate on the first trench between the first gate and the second gate.

In some embodiments, the first through third gates extend side by side with each other.

In some embodiments, a height of the first protrusion structure is different from a height of the second protrusion structure.

In some embodiments, the first protrusion structure comprises a first inclined surface on the side of the first trench and a second inclined surface on the side of the second trench, wherein the first inclined surface has a first angle of inclination, and the second inclined surface has a second angle of inclination that is different from the first angle of inclination.

According to another aspect of the present disclosure, there is provided a semiconductor device comprising a first trench that defines a first active region and a second active region separated from each other and has a first depth, a first fin in the first active region, a second fin in the second active region, a second trench that is immediately adjacent a first short side of the first fin and has a second depth smaller than the first depth, a third trench that is immediately adjacent a second short side of the second fin and has a third depth smaller than the first depth, a first protrusion structure which protrudes from a bottom of the second trench, a first protrusion structure that protrudes from a bottom of the second trench, a second protrusion structure which protrudes from a bottom of the third trench, a first gate which is formed on the first protrusion structure to extend side by side with the first short side and a second gate which is formed on the second protrusion structure to extend side by side with the second short side.

In some embodiments, the first short side and the second short side face each other.

In some embodiments, the first protrusion structure is located at a boundary between the first trench and the second trench, and the second protrusion structure is located at a boundary between the first trench and the third trench.

In some embodiments, the semiconductor device further includes a third gate on the first trench between the first gate and the second gate.

In some embodiments, the first through third gates extend side by side with each other.

In some embodiments, a height of the first protrusion structure is different from a height of the second protrusion structure.

In some embodiments, the first protrusion structure comprises a first inclined surface on the side of the first trench and a second inclined surface on the side of the second trench, wherein the first inclined surface has a first angle of inclination, and the second inclined surface has a second angle of inclination that is different from the first angle of inclination.

According to another aspect of the present disclosure, there is provided a semiconductor device comprising a first trench that defines an active region and has a first depth, a fin in the active region and comprises long sides and short sides, a second trench that is immediately adjacent the long and short sides of the fin in the active region and has a second depth smaller than the first depth, a field insulating layer that partially fills the first trench and the second trench, a first protrusion structure that protrudes from a bottom of the second trench to a height lower than a surface of the field insulating layer and extends side by side with the short sides of the fin and a second protrusion structure that protrudes from the bottom of the second trench to a height lower than the surface of the field insulating layer and extends side by side with the long sides of the fin.

In some embodiments, the semiconductor device further includes a gate which is formed on the first protrusion structure to extend side by side with one of the short sides.

According to another aspect of the present disclosure, there is provided a method of fabricating a semiconductor device, the method comprising forming a plurality of fins and a plurality of sacrificial fins by forming a plurality of first trenches having a first depth, defining an active region by forming a second trench having a second depth greater than the first depth and forming a field insulating layer that partially fills the first and second trenches, wherein the forming of the second trench comprises removing some of the fins and all of the sacrificial fins and forming a first protrusion structure at a boundary between a first trench and the second trench.

In some embodiments, the first protrusion structure is side by side with a short side of one of the plurality of fins, and the method further comprises forming a gate, that extends side by side with the short side, on the first protrusion structure after the forming of the field insulating layer.

In some embodiments, the forming of the second trench comprises forming a second protrusion structure which is disposed side by side with a long side of one of the plurality of fins.

In some embodiments, in the forming of the field insulating layer, the field insulating layer is formed to completely cover the first protrusion structure.

According to some embodiments of the present disclosure, a semiconductor device includes a first trench that defines a first active region and a second active region separated from each other and has a first depth, a first fin in the first active region, a second fin in the second active region, a second trench that is immediately adjacent a first short side of the first fin and has a second depth that is less than the first depth, a protrusion structure that protrudes from a bottom of the second trench, a first gate on the protrusion structure and that extends side by side with the first short side, and a second gate on the second fin and that extends side by side with a second short side of the second fin.

In some embodiments, the first short side and the second short side face each other. Some embodiments provide that the protrusion structure is located at a boundary between the first trench and the second trench. In some embodiments, the first and second gates extend side by side with each other. Some embodiments provide that the protrusion structure comprises a first inclined surface on the side of the first trench and a second inclined surface on the side of the second trench, wherein the first inclined surface has a first angle of inclination, and the second inclined surface has a second angle of inclination that is different from the first angle of inclination. Some embodiments include a third trench that is immediately adjacent a first short side of the second fin and has a third depth that is less than the first depth, wherein a boundary between the first trench and the third trench is substantially without a protrusion structure.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
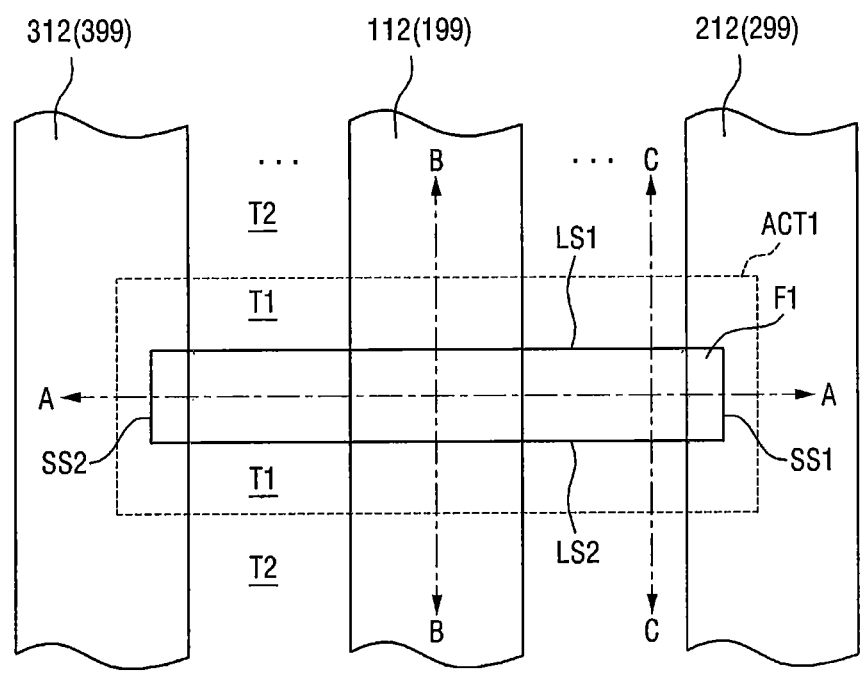
FIG. 1 is a layout view of a semiconductor device according to a first embodiment of the present disclosure.
Figure 1:
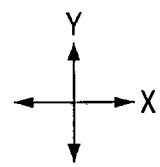

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
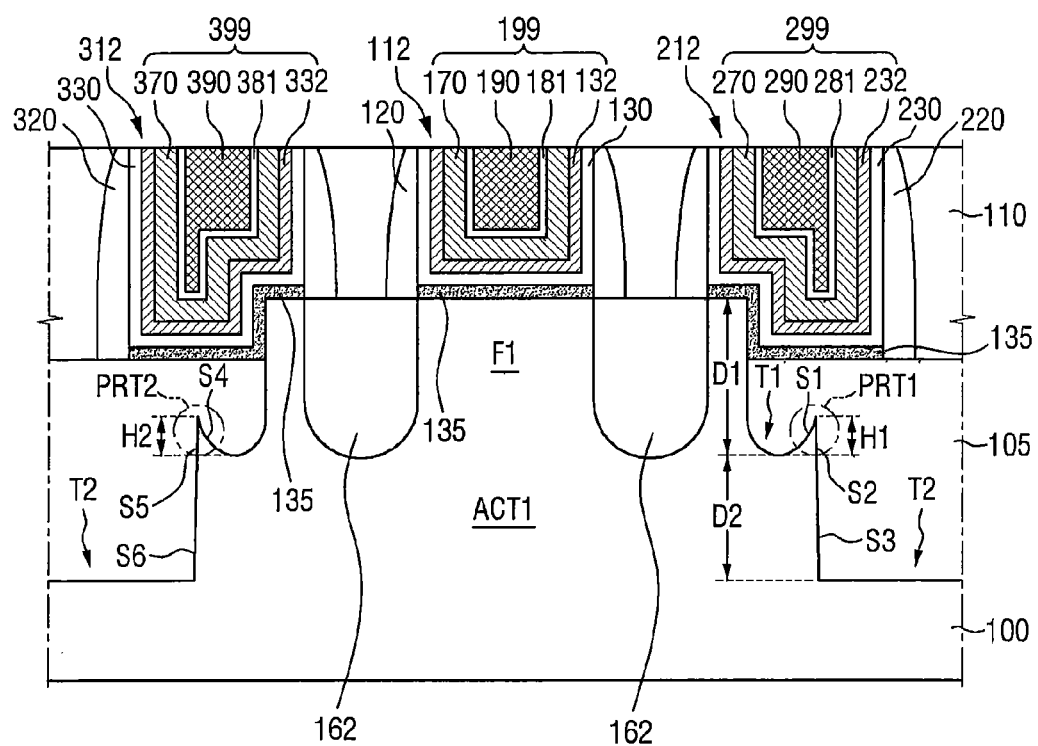
FIG. 2 is a cross-sectional view taken along the line A-A of FIG. 1.
Figure 3:
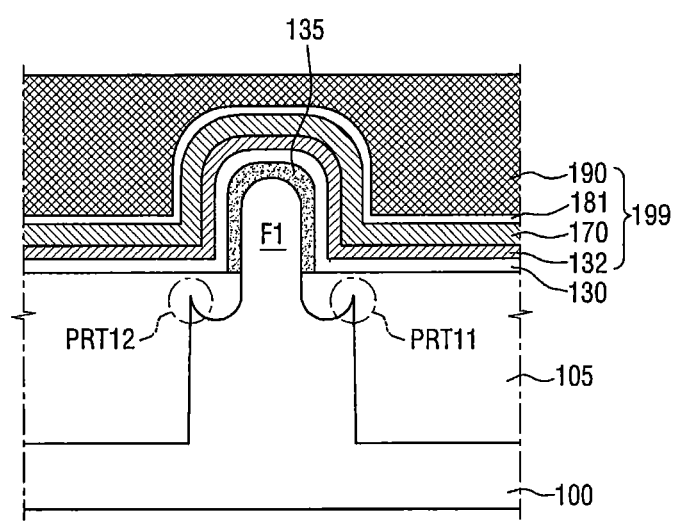
FIG. 3 is a cross-sectional view taken along the line B-B of FIG. 1.
Figure 4:
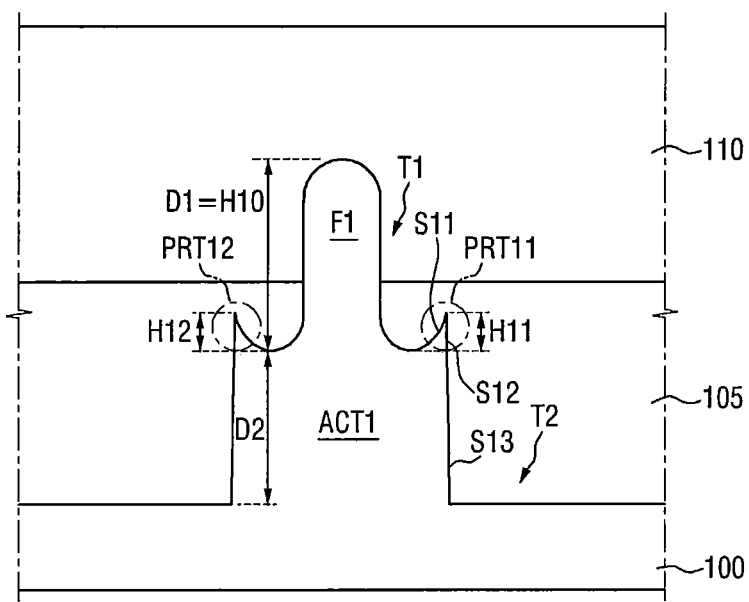
FIG. 4 is a cross-sectional view taken along the line C-C of FIG. 1.

FIG. 1 is a layout view of a semiconductor device according to a first embodiment of the present disclosure. FIG. 2 is a cross-sectional view taken along the line A-A of FIG. 1. FIG. 3 is a cross-sectional view taken along the line B-B of FIG. 1. FIG. 4 is a cross-sectional view taken along the line C-C of FIG. 1. A case where the semiconductor device according to the first embodiment of the present disclosure is an N-type fin transistor will be described below, but the present disclosure is not limited to this case.

Referring to FIGS. 1 through 4, the semiconductor device according to the first embodiment is formed in an active region ACT1 of a substrate 100. The substrate 100 may be made of one or more semiconductor materials, and may be at least one of Si, Ge, SiGe, GaP, GaAs, SiC, SiGeC, InAs, and/or InP. In some embodiments, the substrate 100 may be a silicon-on-insulator (SOI) substrate.

A fin F1 may extend along a first direction X. The fin F1 may be formed by partially etching the substrate 100 and/or may include an epitaxial layer grown from the substrate 100.

If the fin F1 is rectangular as illustrated in the drawings, it may include long sides LS1 and LS2 and short sides SS1 and SS2. Corners of the fin F1 may be slightly obliquely cut (that is, chamfered). While the fin F1 is rectangular in the drawings, the shape of the fin F1 is not limited to the rectangular shape.

As illustrated in the drawings, one fin F1 may be formed in the active region ACT1 (i.e., a single fin structure). That is, the semiconductor device according to the first embodiment of the present disclosure may be a fin transistor using one fin F1. Unlike in the drawings, two or more fins F1 can be formed in the active region ACT1 (i.e., a dual fin structure or a multi-fin structure).

A metal gate 199 may be formed on the fin F1 to intersect the fin F1. That is, the metal gate 199 may extend along a second direction Y. The metal gate 199 may include a lower metal layer 132, an N-type work function control layer 170, a wetting layer 181, and a gap-fill layer 190. The metal gate 199 may be fabricated by a replacement process.

An interlayer insulating film 110 may be formed on the substrate 100 and include a trench 112. The interlayer insulating film 110 may be formed by stacking two or more insulating layers. As illustrated in the drawings, sidewalls of the trench 112 may contact spacers 120.

The spacers 120 may include at least one of a nitride layer and an oxynitride layer.

An interface layer 135 may be formed in the trench 112. As illustrated in the drawings, the interface layer 135 may be formed on a bottom surface of the trench 112 by an oxidation process. In some embodiments, unlike in the drawings, the interface layer 135 may be conformally formed along the sidewalls and bottom surface of the trench 112 by a deposition method. Examples of the deposition method may include, but not limited to, chemical vapor deposition (CVD) and atomic layer deposition (ALD). The interface layer 135 may be, but is not limited to, a silicon oxide layer (such as HTO). The interface layer 135 may be formed to a thickness of approximately 50 Å or less (approximately 5 to 50 Å). For example, the interface layer 135 may have a thickness of 10 Å. The interface layer 135 is used to improve operating characteristics (e.g., to increase a breakdown voltage) of a high-voltage transistor.

A dielectric layer 130 may be conformally formed on the interface layer 135 along the sidewalls and bottom surface of the trench 112. The dielectric layer 130 and the interface layer 135 may contact each other. The dielectric layer 130 may include a high-k material having a higher dielectric constant than a silicon oxide layer. For example, the dielectric layer 130 may include at least one of $HfO_2$, $ZrO_2$, $Ta_2O_5$, $TiO_2$, $SrTiO_3$, and/or $(Ba,Sr)TiO_3$. The dielectric layer 130 may be formed to an appropriate thickness according to the type of device to be formed. For example, the dielectric layer 130, if made of $HfO_2$, may have a thickness of approximately 50 Å or less (approximately 5 to 50 Å).

The lower metal layer 132 may be conformally formed on the dielectric layer 130 along the sidewalls and bottom surface of the trench 112. The lower metal layer 132 may include at least one of, e.g., TiN and/or TaN. For example, the lower metal layer 132 may be a stacked layer of TiN and TaN. In this case, TiN may be formed to contact the dielectric layer 130, and TaN may be formed on TiN to contact TiN. TiN may protect the dielectric layer 130, and TaN may be used as an etch-stop layer when part of the N-type work function control layer 170 is removed.

The N-type work function control layer 170 may be formed on the lower metal layer 132 within the trench 112. As illustrated in the drawings, the N-type work function control layer 170 may also be conformally formed along the sidewalls and bottom surface of the trench 112. The N-type work function control layer 170 adjusts the operating characteristics of the N-type transistor by controlling a work function of the N-type transistor. The N-type work function control layer 170 may be at least one of TiAl, TiAlC, TiAlN, TaC, TiC, and/or HfSi. For example, the N-type work function control layer 170 may be a TiAlC layer.

The wetting layer 181 may be formed on the N-type work function control layer 170 within the trench 112. The wetting layer 181 may include at least one of TiN and/or Ti. In some embodiments, the wetting layer 181 may include a TiN layer and a TiN layer stacked sequentially. For example, if the gap-fill layer 190 is Al, the wetting layer 181 may be a single layer of Ti or TiN. If the gap-fill layer 190 is W, the wetting layer 181 may be a single layer of TiN. The wetting layer 181 may be formed to a thickness of approximately 10 to 100 Å (e.g., 70 Å).

A dummy gate 299 may extend along the second direction Y to overlap the short side SS1 of the fin F1. In addition, a dummy gate 399 may extend along the second direction Y to overlap the short side SS2 of the fin F1. Part of each of the dummy gates 299 and 399 may directly contact a surface of a field insulating layer 105.

Like the metal gate 199, the dummy gates 299 and 399 may be fabricated by a replacement process. The stacked structure and material of each of the dummy gates 299 and 399 may be the same as those of the metal gate 199. Specifically, trenches 212 and 312 may be formed in the interlayer insulating film 110, interface layers and high-k dielectric layers 230 and 330 may be formed in the trenches 212 and 312, and lower metal layers 232 and 332, N-type work function control layers 270 and 370, wetting layers 281 and 381, and gap-fill layers 290 and 390 may be formed on the dielectric layers 230 and 330, respectively.

In addition, source/drain regions 162 may be formed in the fin F1 between the metal gate 199 and the dummy gates 299 and 399. The source/drain regions 162 may be formed by injecting dopants in an implantation process. In some embodiments, the source/drain regions 162 may be formed by forming a recess by partially removing the fin F1 between the metal gate 199 and the dummy gates 299 and 399 and forming an epitaxial layer in the recess. Here, the epitaxial layer may be grown to a height equal to or higher than a surface of the fin F1.

Referring to FIGS. 1 and 2, the fin F1 may be defined by a first trench T1 having a first depth D1, and the active region ACT1 may be defined by a second trench T2 having a second depth D1+D2 greater than the first depth D1. The first trench T1 may be a shallow trench, and the second trench T2 may be a deep trench.

Here, the first trench T1 and the second trench T2 may be disposed immediately adjacent to each other. When the first trench T1 and the second trench T2 are immediately adjacent one another, another trench (i.e., another shallow trench) having the first depth D1 is not disposed between the first trench T1 and the second trench T2.

The field insulating layer 105 may partially fill the first trench T1 and the second trench T2.

Protrusion structures PRT1 and PRT2 may protrude from the bottom of the first trench T1 to a height lower than the surface of the field insulating layer 105. As illustrated in the drawings, the protrusion structures PRT1 and PRT2 may be located at a boundary between the first trench T1 and the second trench T2.

The protrusion structures PRT1 and PRT2 may be formed along the short sides SS1 and SS2 (i.e., (the second direction Y).

The protrusion structure PRT1 may include a first inclined surface S1 disposed on the side of the first trench T1 and a second inclined surface S2 disposed on the side of the second trench T2. The first inclined surface S1 may have a first angle of inclination, and the second inclined surface S2 may have a second angle of inclination different from the first angle of inclination. As illustrated in the drawings, the second angle of inclination may be greater than the first angle of inclination. The first inclined surface S1 is connected to the first trench T1, and the second inclined surface S2 is connected to the second trench T2. The angle of inclination of the second inclined surface S2 may be equal to an angle of inclination of a sidewall S3 of the second trench T2. That is, the second inclined surface S2 and the sidewall S3 of the second trench T2 may lie on the same straight line.

The protrusion structures PRT1 and PRT2 may be disposed on both sides of the active region ACT1 with respect to the fin F1. In addition, as illustrated in the drawings, the first protrusion structure PRT1 and the second protrusion structure PRT2 may be symmetric to each other with respect to the fin F1.

That is, the second protrusion structure PRT2 may include an inclined surface S4 disposed on the side of the first trench T1 and an inclined surface S5 disposed on the side of the second trench T2. The inclined surface S4 and the inclined surface S5 may have different angles of inclination. In addition, the angle of inclination of the inclined surface S5 and an angle of inclination of a sidewall S6 of the second trench T2 may lie on the same straight line.

Referring to FIGS. 1 and 4, protrusion structures PRT11 and PRT12 may protrude from the bottom of the first trench T1 to a height lower than the surface of the field insulating layer 105. As illustrated in the drawings, the protrusion structures PRT11 and PRT12 may be located at the boundary between the first trench T1 and the second trench T2. The protrusion structures PRT11 and PRT12 may be formed along the long sides LS1 and LS2 (i.e., the first direction X) of the fin F1. The metal gate 199 may intersect the fin F1 and the protrusion structures PRT11 and PRT12.

Each of the protrusion structures PRT11 and PRT12 may include an inclined surface S11 disposed on the side of the first trench T1 and an inclined surface S12 disposed on the side of the second trench T2. An angle of inclination of the inclined surface S11 may be different from an angle of inclination of the inclined surface S12. As illustrated in the drawings, the angle of inclination of the inclined surface S12 may be greater than the angle of inclination of the inclined surface S11. The inclined surface S11 is connected to the first trench T1, and the inclined surface S12 is connected to the second trench T2. The angle of inclination of the inclined surface S12 may be equal to an angle of inclination of a sidewall S13 of the second trench T2. That is, the inclined surface S12 and the sidewall S13 of the second trench T2 may lie on the same straight line.

The protrusion structures PRT11 and PRT12 may be disposed on both sides of the active region ACT1 with respect to the fin F1. In addition, as illustrated in the drawings, the protrusion structure PRT11 and the protrusion structure PRT12 may be symmetric to each other with respect to the fin F1.

The protrusion structures PRT1, PRT2, PRT11 and PRT12 will now be described in greater detail.

Figure 14:
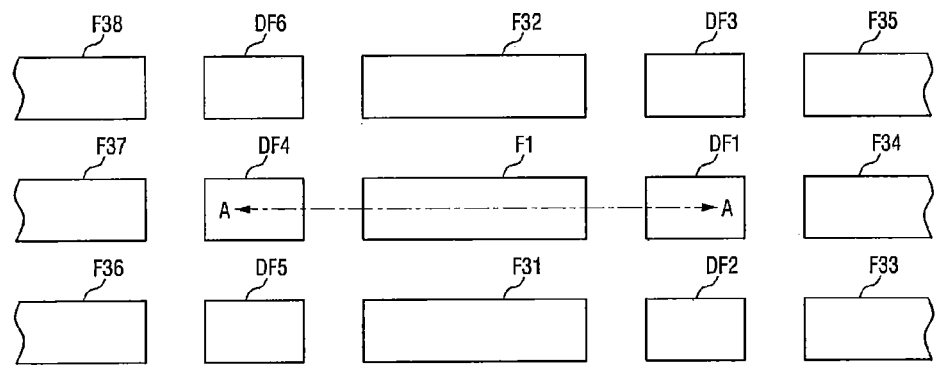
FIGS. 14 and 17 are views illustrating operations in a method of fabricating the semiconductor device according to the first embodiment of the present disclosure.
Figure 14:
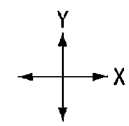
Figure 15:
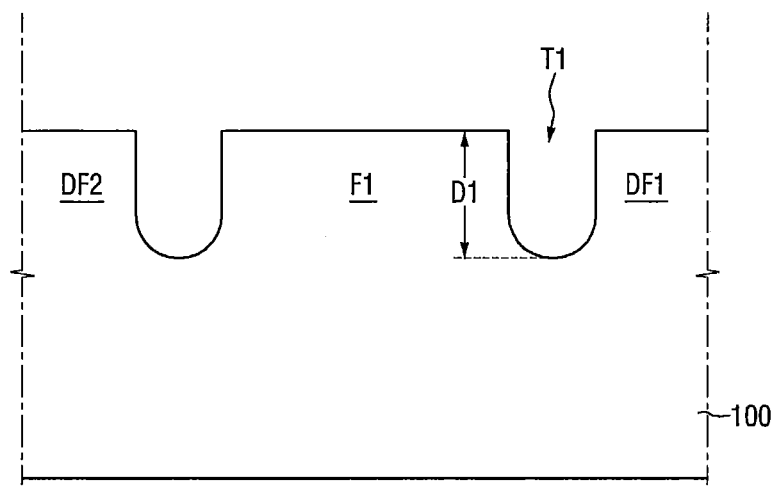

A plurality of fins and a plurality of sacrificial fins are formed by forming the first trench T1 having the first depth D1 in a plurality (see FIGS. 14 and 15). Then, the second trench T2 having the second depth D1+D2 greater than the first depth D1 is formed to define the active region ACT1 (see FIGS. 16 and 17). Here, of the fins (e.g., three fins), a target number (e.g., one) of fins may be left when the second trench T2 is formed. In addition, all of the sacrificial fins may be removed when the second trench T2 is formed. However, if a mask for forming the first trench T1 and a mask for forming the second trench T2 are not perfectly aligned with each other, fins and sacrificial fins that should be removed when the second trench T2 is formed may not be removed completely and thus may leave traces. These traces of the fins and sacrificial fins may be the protrusion structures PRT1, PRT2, PRT11 and PRT12.

Here, if the protrusion structures PRT1, PRT2, PRT11 and PRT12 are considerably large in size, they may cause a defect in a subsequent process. However, tightly managing process conditions to completely remove the protrusion structures PRT1, PRT2, PRT11 and PRT12 can create development load. Therefore, the sizes of the protrusion structures PRT1, PRT2, PRT11 and PRT12 may be managed within an appropriate range in order to minimize the development load and increase yields. For example, heights H1, H2, H11 and H12 of the protrusion structures PRT1, PRT2, PRT11 and PRT12 may be managed to be lower than a height H10 of the fin F1, in particular, lower than the surface of the field insulating layer 105. This is because tip ends of the protrusion structures PRT1, PRT2, PRT11 and PRT12, if higher than the surface of the field insulating layer 105, can cause a process defect (e.g., a short circuit) in a subsequent replacement process. Therefore, in semiconductor devices according to some embodiments of the present disclosure, the development load can be minimized by appropriately controlling the sizes of the protrusion structures PRT1, PRT2, PRT11 and PRT12.

Figure 5:
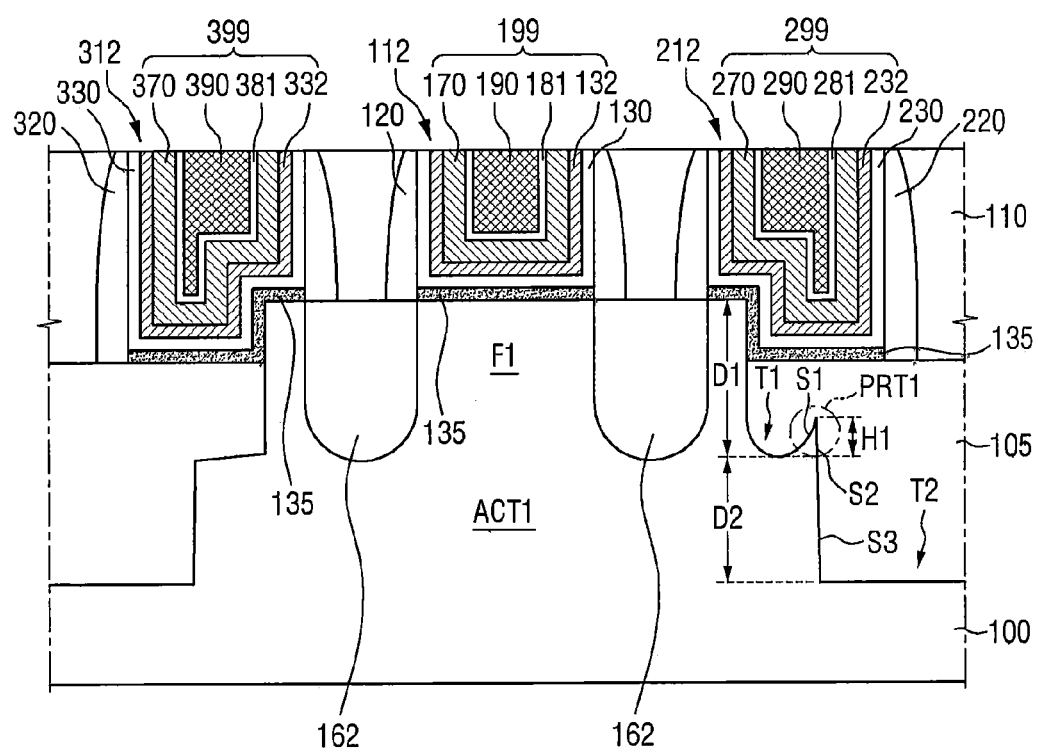
FIG. 5 is a cross-sectional view of a semiconductor device according to a second embodiment of the present disclosure.

FIG. 5 is a cross-sectional view of a semiconductor device according to a second embodiment of the present disclosure. For simplicity, the current embodiment will be described, focusing mainly on differences with the embodiment of FIGS. 1 through 4.

Referring to FIG. 5, in the semiconductor device according to the second embodiment of the present disclosure, a protrusion structure PRT1 may be disposed on only one side of an active region ACT1 with respect to a fin F1.

The protrusion structure PRT1 may have a height of H1 which is lower than a surface of a field insulating layer 105. The protrusion structure PRT1 may include a first inclined surface S1 disposed on the side of a first trench T1 and a second inclined surface S2 disposed on the side of a second trench T2. The first inclined surface S1 may have a first angle of inclination, and the second inclined surface S2 may have a second angle of inclination different from the first angle of inclination. As illustrated in the drawing, the second angle of inclination may be greater than the first angle of inclination. The first inclined surface S1 is connected to the first trench T1, and the second inclined surface S2 is connected to the second trench T2.

Figure 6:
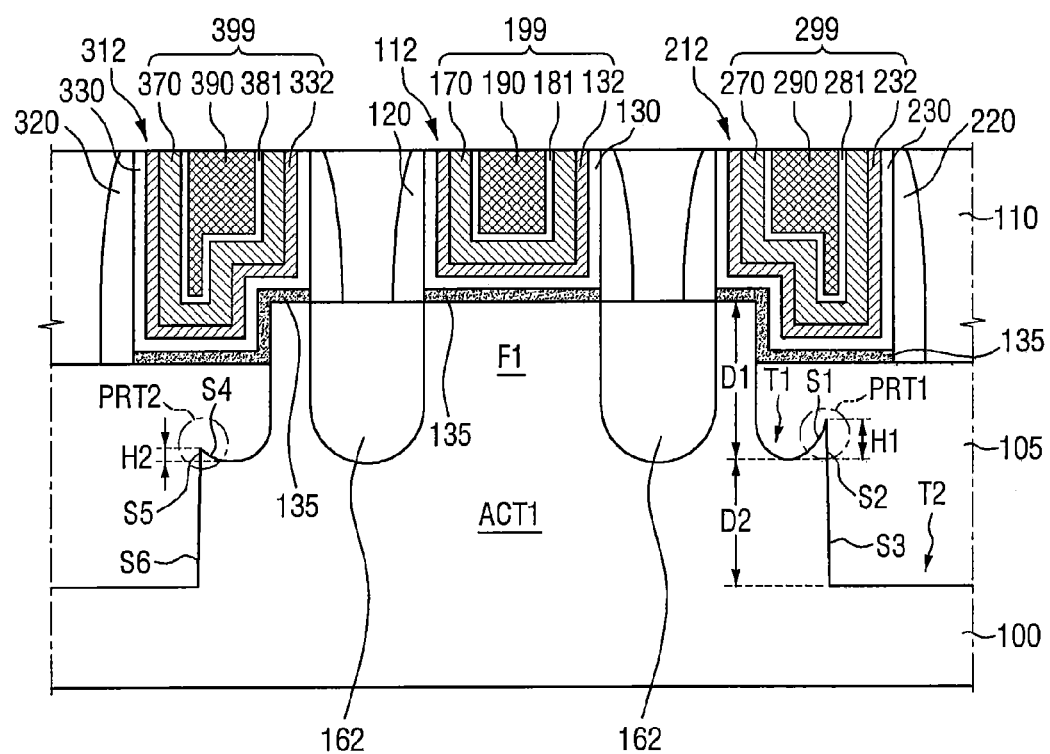
FIG. 6 is a cross-sectional view of a semiconductor device according to a third embodiment of the present disclosure.

FIG. 6 is a cross-sectional view of a semiconductor device according to a third embodiment of the present disclosure. For simplicity, the current embodiment will be described, focusing mainly on differences with the embodiment of FIGS. 1 through 4.

Referring to FIG. 6, in the semiconductor device according to the third embodiment of the present disclosure, protrusion structures PRT1 and PRT2 may be asymmetric to each other with respect to a fin F1.

The first protrusion structure PRT1 and the second protrusion structure PRT2 may have different sizes. In addition, a height H1 of the first protrusion structure PRT1 and a height H2 of the second protrusion structure PRT2 may be different. As illustrated in the drawing, the first protrusion structure PRT1 may be larger than the second protrusion structure PRT2, and the height H1 of the first protrusion structure PRT1 may be greater than the height H2 of the second protrusion structure PRT2.

Figure 7:
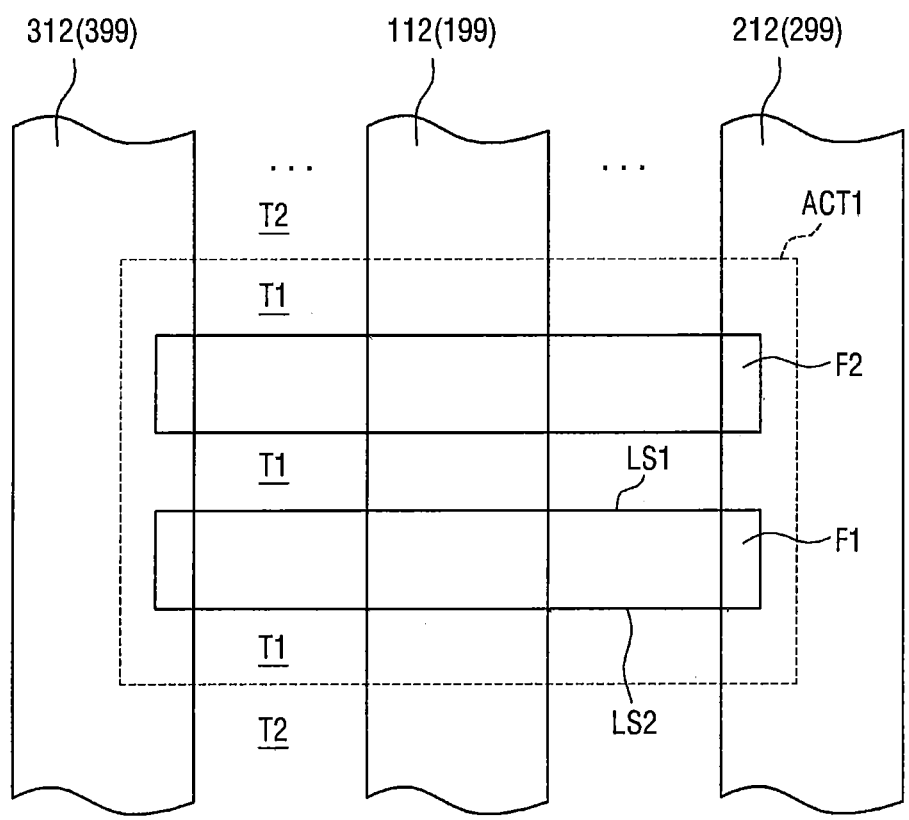
FIG. 7 is a layout view of a semiconductor device according to a fourth embodiment of the present disclosure.
Figure 8:
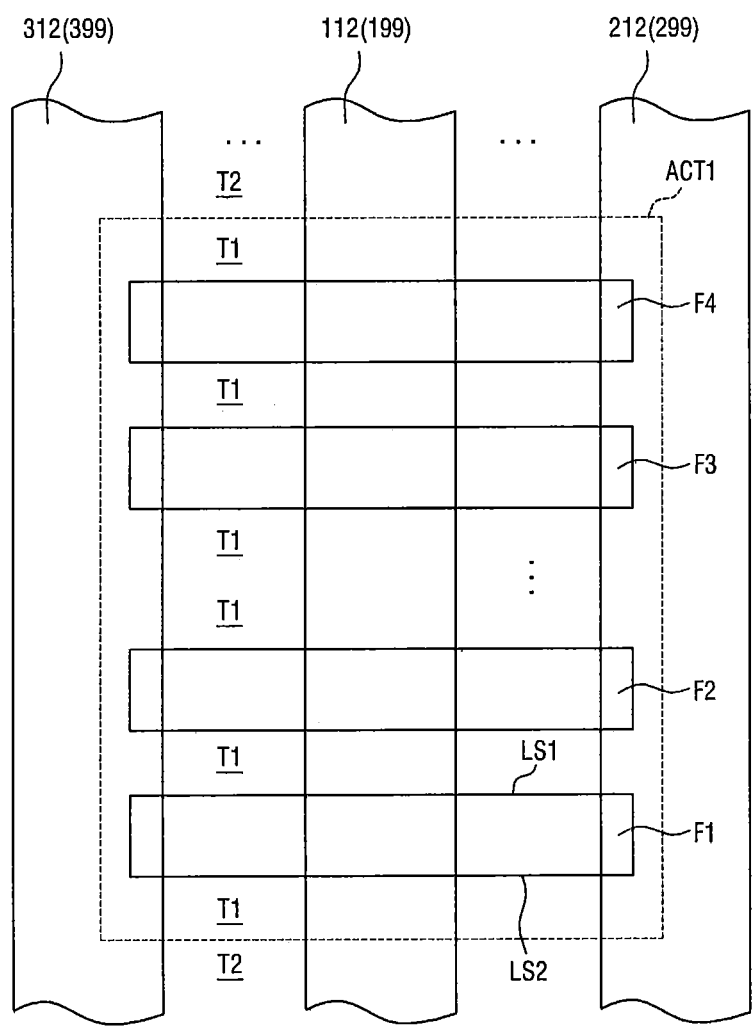
FIG. 8 is a layout view of a semiconductor device according to a fifth embodiment of the present disclosure.

FIGS. 7 and 8 respectively are layout views of semiconductor devices according to fourth and fifth embodiments of the present disclosure. For simplicity, the current embodiments will be described, focusing mainly on differences with the embodiment of FIGS. 1 through 4.

Referring to FIG. 7, the semiconductor device according to the fourth embodiment of the present disclosure may be a fin-transistor using two fins F1 and F2 (a dual fin structure). That is, two fins F1 and F2 may be formed in a first active region ACT1.

A dummy gate 299 may extend along a second direction Y to overlap a short side of each of the fins F1 and F2. In addition, a dummy gate 399 may extend along the second direction Y to overlap the other short side of each of the fins F1 and F2.

Referring to FIG. 8, the semiconductor device according to the fifth embodiment of the present disclosure may be a fin transistor using three or more fins F1 through F4 (a multi-fin structure). That is, three or more fins F1 through F4 may be formed in a first active region ACT1.

A dummy gate 299 may extend along a second direction Y to overlap a short side of each of the fins F1 through F4.

In addition, a dummy gate 399 may extend along the second direction Y to overlap the other short side of each of the fins F1 through F4.

Figure 9:
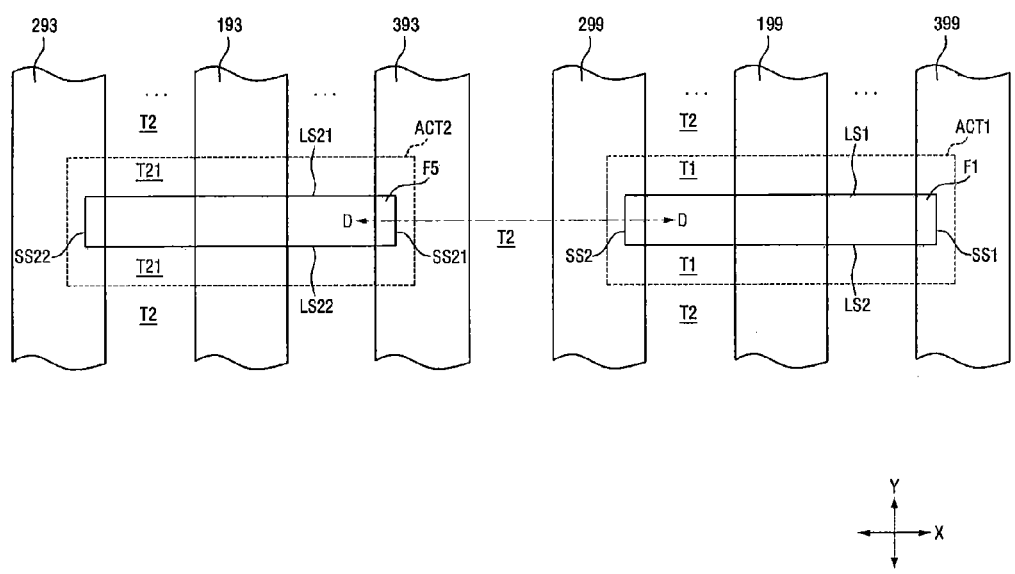
FIG. 9 is a layout view of a semiconductor device according to a sixth embodiment of the present disclosure.
Figure 10:
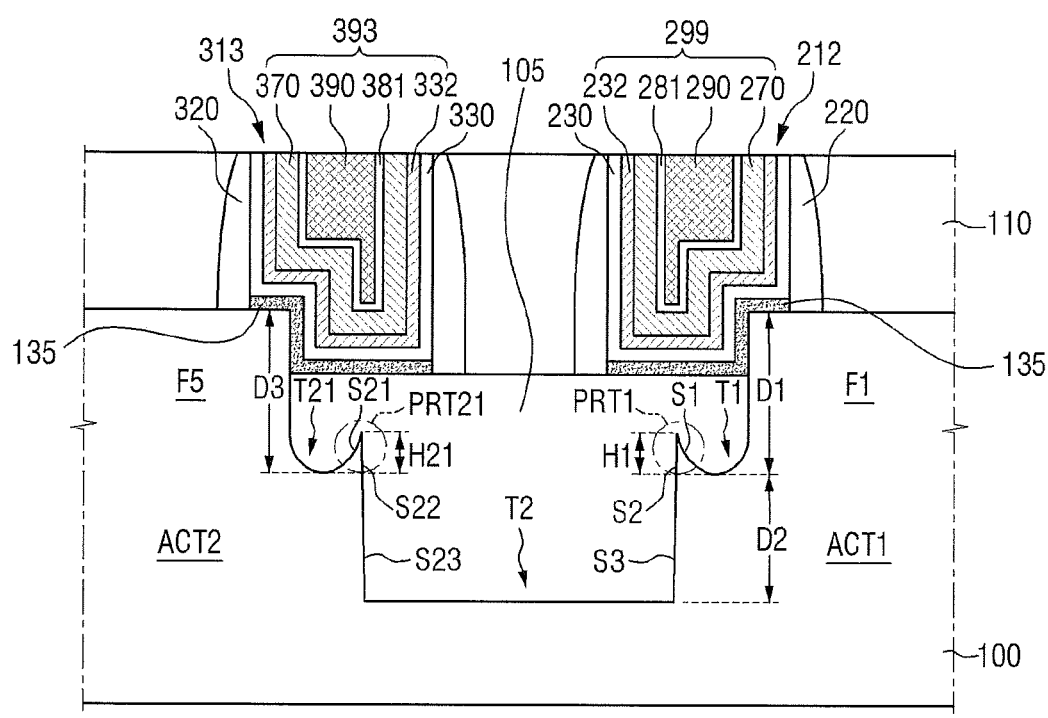
FIG. 10 is a cross-sectional view taken along the line D-D of FIG. 9.

FIG. 9 is a layout view of a semiconductor device according to a sixth embodiment of the present disclosure. FIG. 10 is a cross-sectional view taken along the line D-D of FIG. 9. For simplicity, the current embodiment will be described, focusing mainly on differences with the embodiment of FIGS. 1 through 4.

Referring to FIGS. 9 and 10, the semiconductor device according to the sixth embodiment of the present disclosure may include a first active region ACT1 and a second active region ACT2 separated from each other. A fin F1 is formed in the first active region ACT 1, and a fin F5 is formed in the second active region ACT2.

The fins F1 and F5 may extend along a first direction X. Each of the fins F1 and F5 may be part of a substrate 100 and/or an epitaxial layer grown from the substrate 100.

If the fin F1 is rectangular as illustrated in the drawings, it may include long sides LS1 and LS2 and short sides SS1 and SS2. In addition, if the fin F5 is rectangular, it may include long sides LS21 and LS22 and short sides SS21 and SS22. Corners of each of the fins F1 and F5 may be slightly obliquely cut (that is, chamfered).

The short side SS2 of the fin F1 and the short side SS21 of the fin F5 may face each other.

Here, the fin F1 may be defined by a first trench T1 having a first depth D1, and the fin F5 may be defined by a fourth trench T21 having a third depth D3. The first trench T1 and the fourth trench T21 may be formed simultaneously. In some embodiments, the first depth D1 and the third depth D3 may be equal.

The active regions ACT1 and ACT2 may be defined by a second trench T2 having a second depth D1+D2 greater than the first depth D1 or the third depth D3.

As illustrated in the drawings, one fin F1 or F5 may be formed in each of the active regions ACT1 and ACT2. However, the present disclosure is not limited thereto. That is, two or more fins can be formed in each of the active regions ACT1 and ACT2.

A metal gate 199 may be formed on the fin F1 to intersect the fin F1. In addition, a metal gate 193 may be formed on the fin F5 to intersect the fin F5. Dummy gates 299 and 399 may be formed on both short sides SS2 and SS1 of the fin F1 to overlap the short sides SS2 and SS1, respectively. Dummy gates 293 and 393 may be formed on both short sides SS22 and SS21 of the fin F5 to overlap the short sides SS22 and SS21, respectively. The metal gates 199 and 193 and the dummy gates 299, 399, 293 and 393 may extend along a second direction Y.

Referring to FIG. 10, a first protrusion PRT1 may protrude from the bottom of the first trench T1 to a height lower than a surface of a field insulating layer 105. The first protrusion structure PRT1 may be located at a boundary between the first trench T1 and the second trench T2. The first protrusion structure PRT1 may include a first inclined surface S1 disposed on the side of the first trench T1 and a second inclined surface S2 disposed on the side of the second trench T2. The first inclined surface S1 may have a first angle of inclination, and the second inclined surface S2 may have a second angle of inclination different from the first angle of inclination. As illustrated in the drawing, the second angle of inclination may be greater than the first angle of inclination.

In addition, a third protrusion structure PRT21 may protrude from the bottom of the fourth trench T21 to a height lower than the surface of the field insulating layer 105. The third protrusion structure PRT21 may be located at a boundary between the fourth trench T21 and the second trench T2. The third protrusion structure PRT21 may include an inclined surface S21 disposed on the side of the fourth trench T21 and an inclined surface S22 disposed on the side of the second trench T2. An angle of inclination of the inclined surface S21 may be different from an angle of inclination of the inclined surface S22.

As illustrated in the drawing, the first protrusion structure PRT1 and the third protrusion structure PRT21 may be symmetric to each other with respect to the second trench T2. In addition, a height H1 of the first protrusion structure PRT1 and a height H21 of the third protrusion structure PRT21 may be equal.

Figure 11:
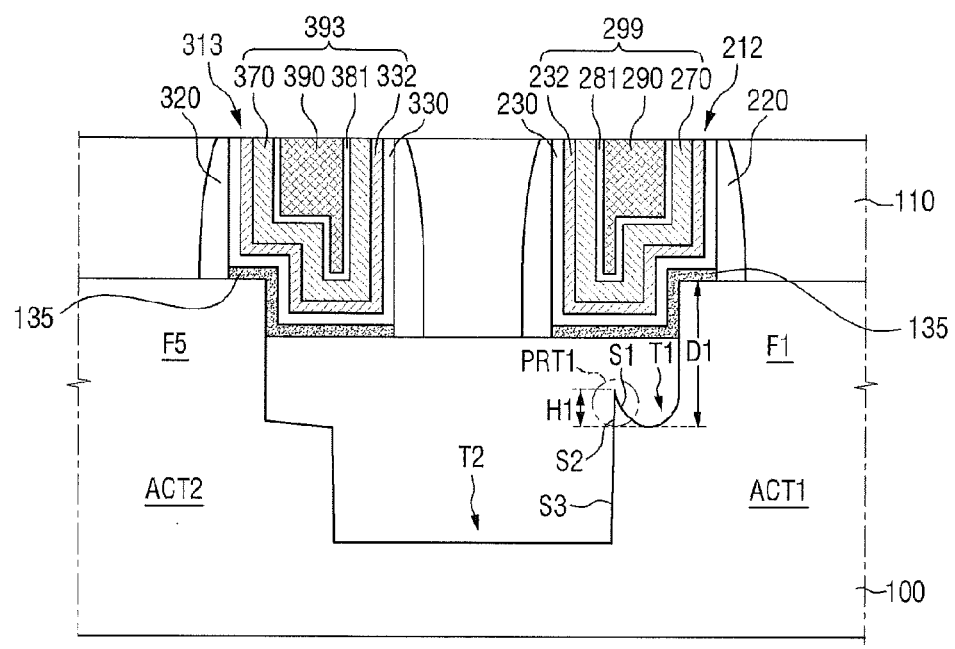
FIG. 11 is a cross-sectional view of a semiconductor device according to a seventh embodiment of the present disclosure.

FIG. 11 is a cross-sectional view of a semiconductor device according to a seventh embodiment of the present disclosure. For simplicity, the current embodiment will be described, focusing mainly on differences with the embodiment of FIGS. 9 and 10.

Referring to FIG. 11, in the semiconductor device according to the seventh embodiment of the present disclosure, a protrusion structure PRT1 may be disposed on only one side of a second trench T2. That is, the protrusion structure PRT1 may be located at a boundary between a first trench T1 and the second trench T2 but not at a boundary between the second trench T2 and a fourth trench T21.

Figure 12:
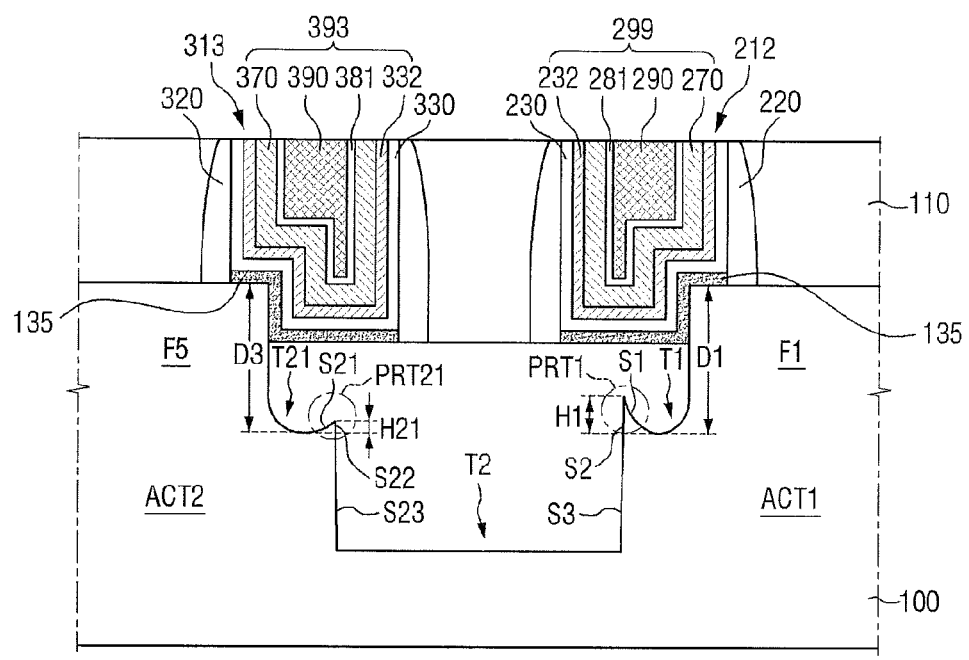
FIG. 12 is a cross-sectional view of a semiconductor device according to an eighth embodiment of the present disclosure.

FIG. 12 is a cross-sectional view of a semiconductor device according to an eighth embodiment of the present disclosure. For simplicity, the current embodiment will be described, focusing mainly on differences with the embodiment of FIGS. 9 and 10.

Referring to FIG. 12, in the semiconductor device according to the eighth embodiment of the present disclosure, protrusion structures PRT1 and PRT21 may be disposed on both sides of a second trench T2. However, the protrusion structures PRT1 and PRT21 may be asymmetric to each other with respect to the second trench T2. In other words, the protrusion structures PRT1 and PRT21 may be different sizes. A height H1 of the protrusion structure PRT1 may be different from a height H21 of the protrusion structure PRT21.

Figure 13:
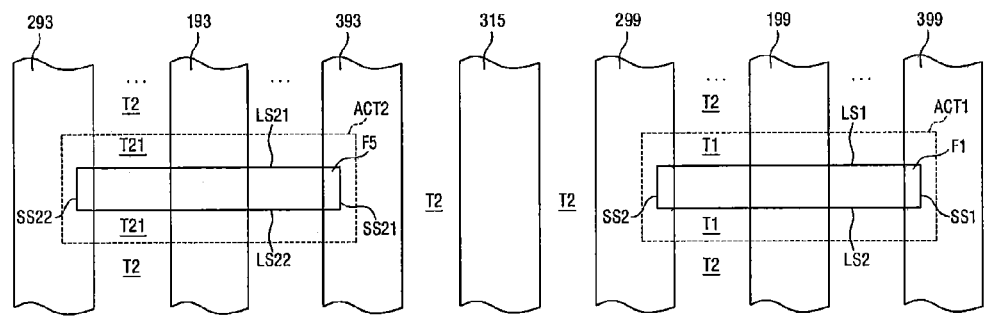
FIG. 13 is a cross-sectional view of a semiconductor device according to a ninth embodiment of the present disclosure.
Figure 13:
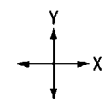

FIG. 13 is a cross-sectional view of a semiconductor device according to a ninth embodiment of the present disclosure. For simplicity, the current embodiment will be described, focusing mainly on differences with the embodiment of FIGS. 9 and 10.

Referring to FIG. 13, in the semiconductor device according to the ninth embodiment of the present disclosure, a gate 315 may be disposed between a dummy gate 299 and a dummy gate 393. The gate 315 may extend side by side with a direction (e.g., a second direction Y) in which the dummy gates 299 and 393 extend. The gate 315 may be a normal gate used by a logic circuit located in another region or may be a dummy gate. The gate 315 may be disposed on a field insulating layer 105 formed in a second trench T2.

Figure 16:
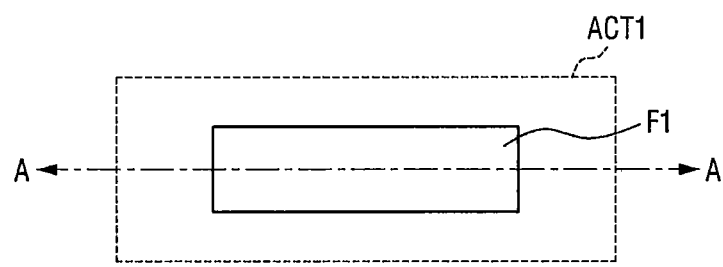
Figure 16:
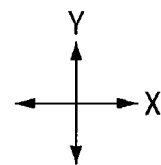
Figure 17:
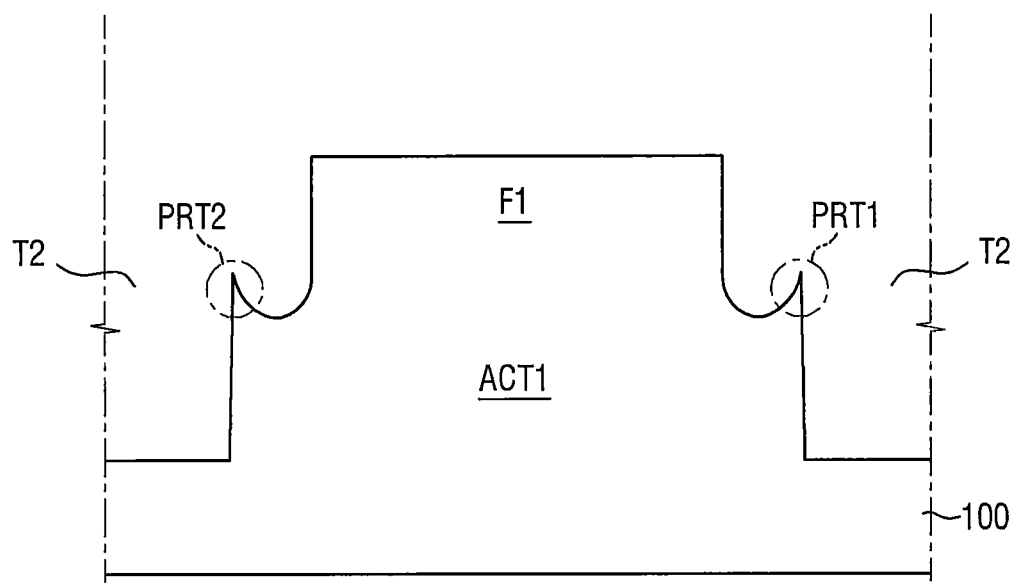

A method of fabricating the semiconductor device according to the first embodiment of the present disclosure will now be described with reference to FIGS. 14 through 17 and 1 through 4. FIGS. 14 and 16 are views illustrating operations of a method of fabricating the semiconductor device according to the first embodiment of the present disclosure. FIGS. 15 and 17 are cross-sectional views taken along the line (A-A) of FIGS. 14 and 16, respectively.

Referring to FIGS. 14 and 15, a plurality of fins F1 and F31 through F38 and a plurality of sacrificial fins DF1 through DF6 are formed on a substrate 100. The fins F1 and F31 through F38 and the sacrificial fins DF1 through DF6 may extend along a first direction X.

Specifically, a mask pattern is formed on the substrate 100, and the substrate 100 is partially etched using the mask pattern. That is, the fins F1 and F31 through F38 and the sacrificial fins DF1 through DF6 are formed by forming a plurality of first trenches T1 having a first depth D1 in the substrate 100.

The fins F1, F31 and F32 are placed such that long sides thereof face each other, the fins F33 through F35 are placed such that long sides thereof face each other, and the fins F36 through F38 are placed such that long sides thereof face each other. The sacrificial fins DF1 through DF3 are placed such that long sides thereof face each other, and the sacrificial fins DF4 through DF6 are placed such that long sides thereof face each other.

First short sides of the fins F1, F31 and F32 may face second short sides of the sacrificial fins DF1 through DF3, and second short sides of the fins F1, F31 and F32 may face first short sides of the sacrificial fins DF4 through DF6.

As illustrated in the drawings, the sacrificial fins DF4 through DF6 may be shorter than the fins F1, F31 and F32.

Referring to FIGS. 16 and 17, an active region ACT1 is defined by forming a second trench T2 having a second depth D1+D2 greater than the first depth D1. The formation of the second trench T2 removes some (F31 through F38) of the fins F1 and F31 through F38 and all of the sacrificial fins DF1 through DF6.

That is, the first and second trenches T1 and T2 partially overlap each other. Accordingly, protrusion structures PRT1, PRT2, PRT11 and PRT12 may be formed at a boundary between the first and second trenches T1 and T2.

The shape of each of the protrusion structures PRT1, PRT2, PRT11 and PRT12 may vary according to the degree of alignment of the first and second trenches T1 and T2. That is, depending on the degree of alignment, the protrusion structures PRT11 and PRT12 may be symmetric to each other (see FIGS. 4 and 17), the protrusion structure PRT11 may be formed on only one side (see FIG. 5), or the protrusion structures PRT11 and PRT12 may be formed on both sides but may be asymmetric to each other (see FIG. 6).

Next, a field insulating layer 105 (see, e.g., FIG. 2) is formed to partially cover the first and second trenches T1 and T2.

Referring again to FIGS. 1 through 4, a metal gate 199 and dummy gates 299 and 399 are formed to intersect the fin F1. Specifically, a poly gate is formed to intersect the fin F1, and an interlayer insulating film 110 is formed to fully cover the fin F1 and the poly gate. Then, a planarization process is performed to expose an upper surface of the poly gate. A trench 112 is formed by removing the exposed poly gate. A dielectric layer 130, the metal gate 199, the dummy gates 299 and 399, etc. are formed in the trench 112.

Methods of fabricating the semiconductor devices according to the second through eighth embodiments of the present disclosure can be fully inferred by those of ordinary skill in the art to which the present disclosure pertains from the above-described method of fabricating the semiconductor device according to the first embodiment of the present disclosure.

Figure 18:
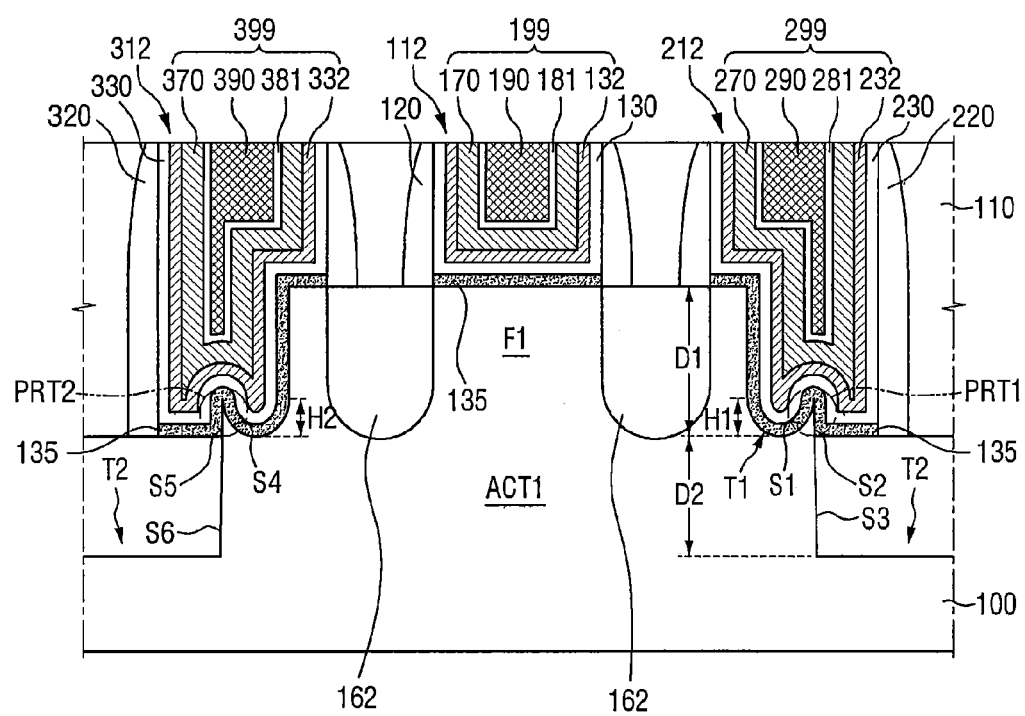
FIG. 18 is a cross-sectional view of a semiconductor device according to a tenth embodiment of the present disclosure.

FIG. 18 is a cross-sectional view of a semiconductor device according to a tenth embodiment of the present disclosure. The semiconductor device according to the current embodiment is substantially the same as the semiconductor device according to the first embodiment of FIG. 2 except that dummy gates 299 and 399 cover protrusion structures PRT1 and PRT2, respectively. Therefore, a redundant description of identical elements will be omitted for the sake of simplicity.

Referring to FIG. 18, the dummy gate 299, a dielectric layer 230, and an interface layer may cover the protrusion structure PRT1. In addition, the dummy gate 399, a dielectric layer 330, and an interface layer may cover the protrusion structure PRT2. Therefore, the dummy gates 299 and 399, the dielectric layers 230 and 330, and the interface layers 135 may be disposed in a first trench T1. In the current embodiment, both of the protrusion structures PRT1 and PRT2 are covered. However, the present disclosure is not limited thereto. In addition, the interface layers 135 disposed in the first trench T1 and interface layers 135 disposed in a second trench T2 may lie in the same plane, but the present disclosure is not limited thereto. Therefore, the interface layers 135 disposed in the second trench T2 may be lower or higher than the protrusion structures PRT1 and PRT2, and the dielectric layers 230 and 330 and the dummy gates 299 and 399 may be disposed on the interface layers 135.

Figure 19:
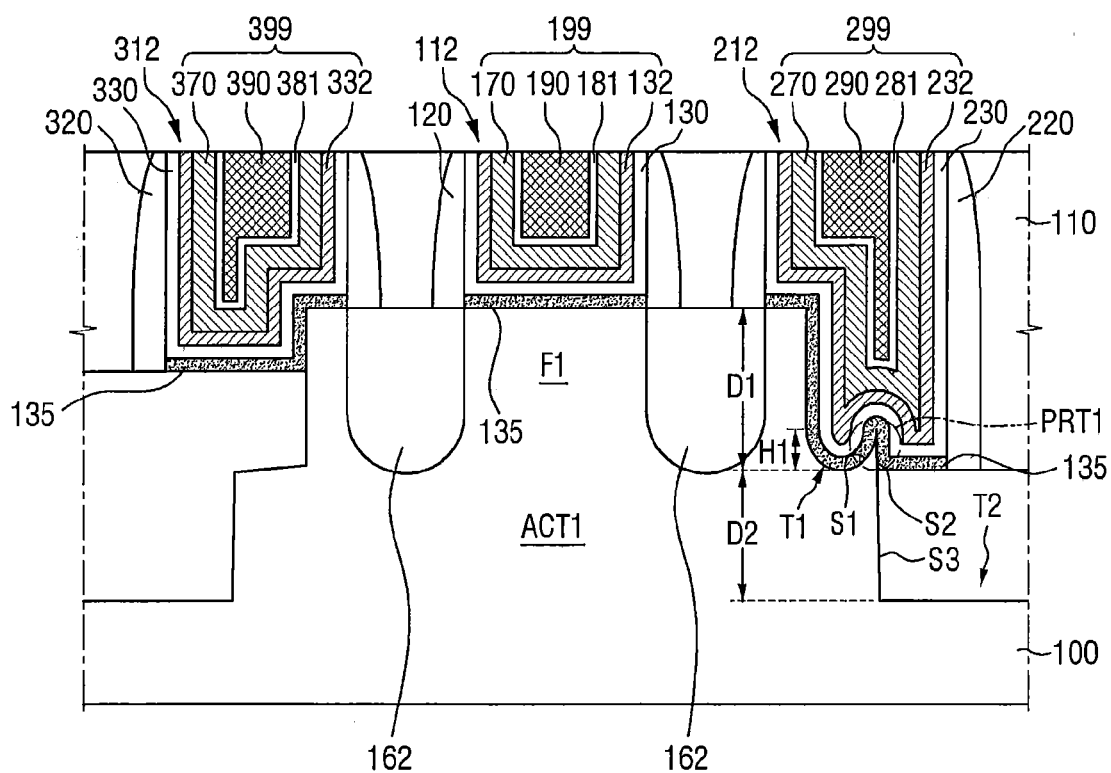
FIG. 19 is a cross-sectional view of a semiconductor device according to an eleventh embodiment of the present disclosure.

FIG. 19 is a cross-sectional view of a semiconductor device according to an eleventh embodiment of the present disclosure. The semiconductor device according to the current embodiment is substantially the same as the semiconductor device according to the second embodiment of FIG. 5 except that a dummy gate 299 covers a protrusion structure PRT1. Therefore, a redundant description of identical elements will be omitted for the sake of simplicity.

Referring to FIG. 19, the dummy gate 299, a dielectric layer 230, and an interface layer 135 may cover the protrusion structure PRT1.

Figure 20:
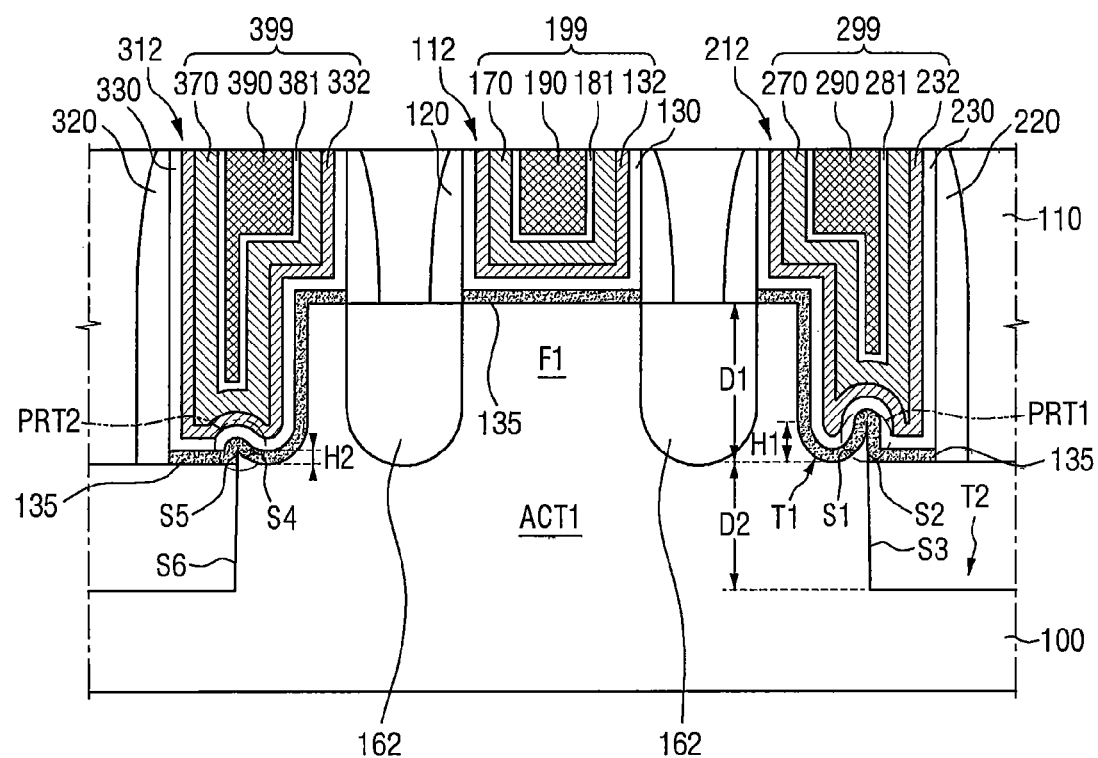
FIG. 20 is a cross-sectional view of a semiconductor device according to a twelfth embodiment of the present disclosure.

FIG. 20 is a cross-sectional view of a semiconductor device according to a twelfth embodiment of the present disclosure. The semiconductor device according to the current embodiment is substantially the same as the semiconductor device according to the third embodiment of FIG. 6 except that dummy gates 299 and 399 cover protrusion structures PRT1 and PRT2, respectively. Therefore, a redundant description of identical elements will be omitted for the sake of simplicity.

Referring to FIG. 20, the dummy gate 299, a dielectric layer 230, and an interface layer 135 may cover the protrusion structure PRT1. In addition, the dummy gate 399, a dielectric layer 330, and an interface layer 135 may cover the protrusion structure PRT2.

Figure 21:
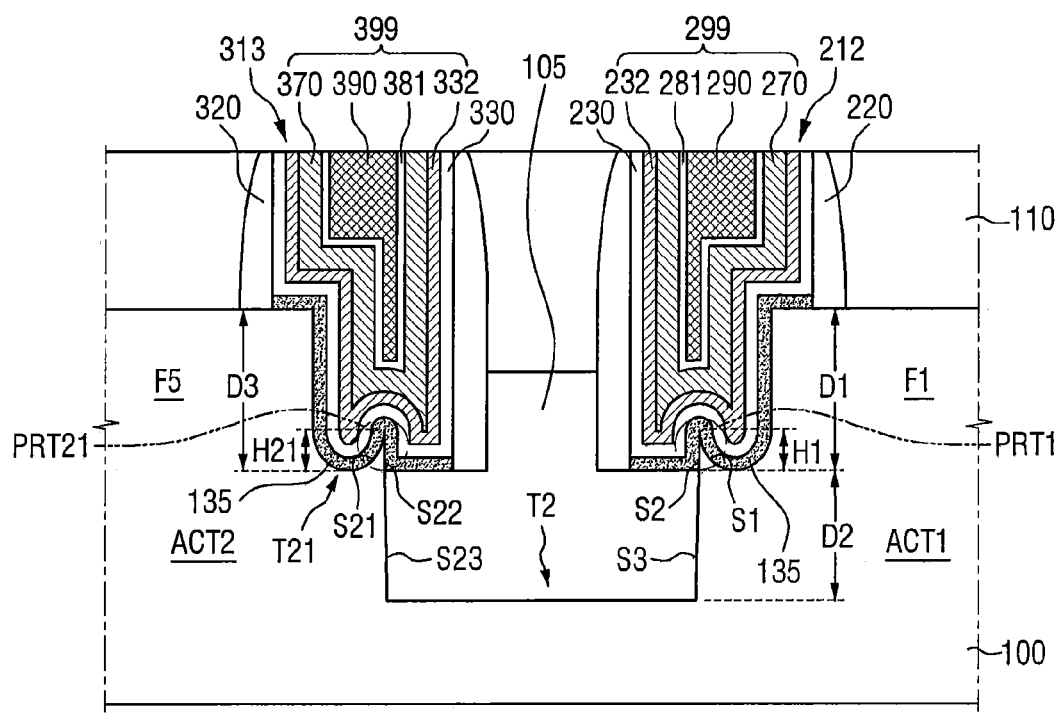
FIG. 21 is a cross-sectional view of a semiconductor device according to a thirteenth embodiment of the present disclosure.

FIG. 21 is a cross-sectional view of a semiconductor device according to a thirteenth embodiment of the present disclosure. The semiconductor device according to the current embodiment is substantially the same as the semiconductor device according to the sixth embodiment of FIG. 10 except that dummy gates 299 and 399 cover protrusion structures PRT1 and PRT2, respectively. Therefore, a redundant description of identical elements will be omitted for the sake of simplicity.

Referring to FIG. 21, the dummy gate 299, a dielectric layer 230, and an interface layer 135 may cover the protrusion structure PRT1. In addition, the dummy gate 399, a dielectric layer 330, and an interface layer 135 may cover the protrusion structure PRT2.

Figure 22:
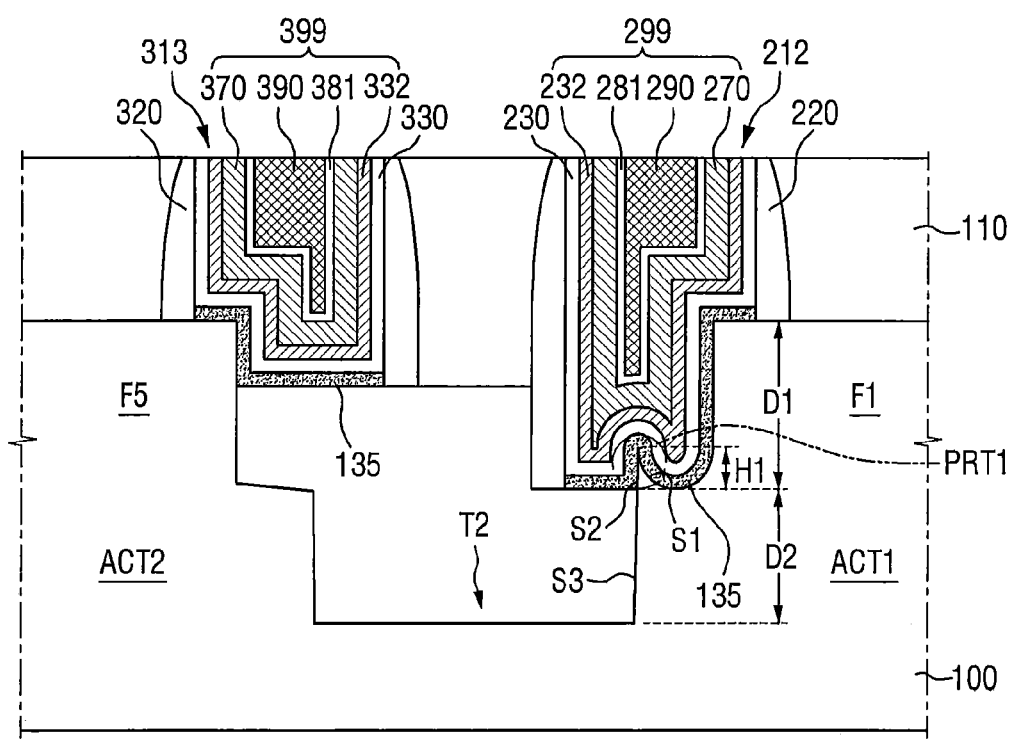
FIG. 22 is a cross-sectional view of a semiconductor device according to a fourteenth embodiment of the present disclosure.

FIG. 22 is a cross-sectional view of a semiconductor device according to a fourteenth embodiment of the present disclosure. The semiconductor device according to the current embodiment is substantially the same as the semiconductor device according to the seventh embodiment of FIG. 11 except that a dummy gate 299 covers a protrusion structure PRT1. Therefore, a redundant description of identical elements will be omitted for the sake of simplicity.

Referring to FIG. 22, the dummy gate 299, a dielectric layer 230, and an interface layer 135 may cover the protrusion PRT1.

Figure 23:
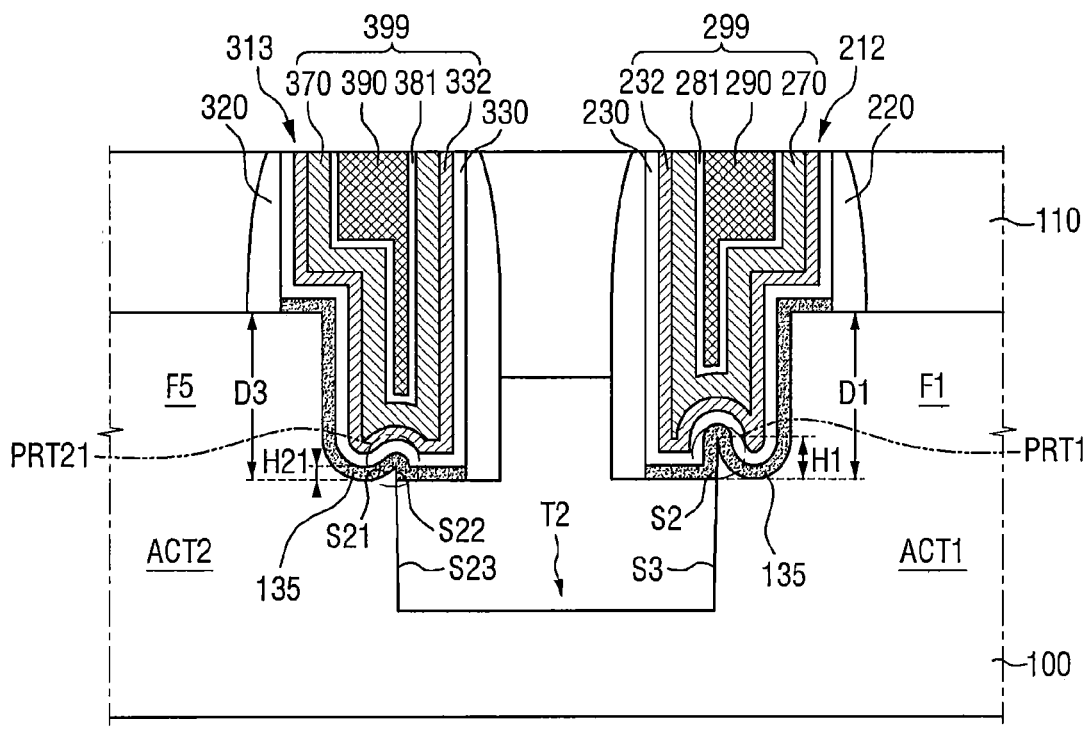
FIG. 23 is a cross-sectional view of a semiconductor device according to a fifteenth embodiment of the present disclosure.

FIG. 23 is a cross-sectional view of a semiconductor device according to a fifteenth embodiment of the present disclosure. The semiconductor device according to the current embodiment is substantially the same as the semiconductor device according to the eighth embodiment of FIG. 12 except that dummy gates 299 and 399 cover protrusion structures PRT1 and PRT2, respectively. Therefore, a redundant description of identical elements will be omitted for the sake of simplicity.

Referring to FIG. 23, the dummy gate 299, a dielectric layer 230, and an interface layer 135 may cover the protrusion structure PRT1. In addition, the dummy gate 399, a dielectric layer 330, and an interface layer 135 may cover the protrusion structure PRT2.

Figure 24:
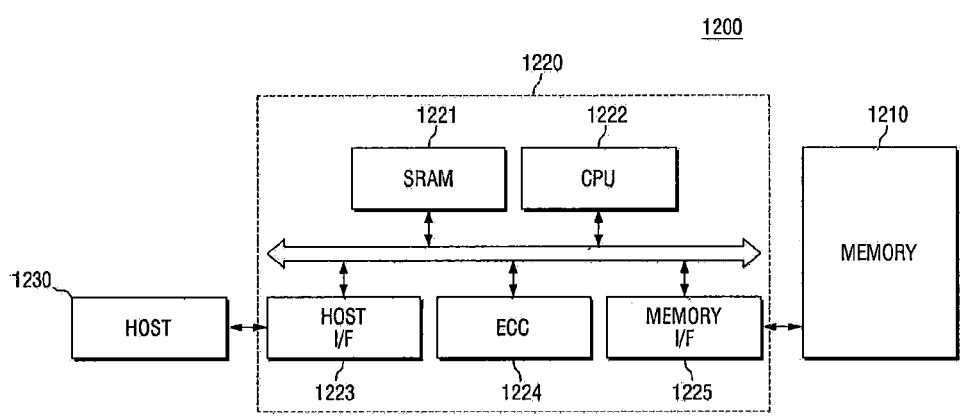
FIG. 24 is a block diagram of a memory card 1200 including semiconductor devices according to embodiments of the present disclosure.
Figure 25:
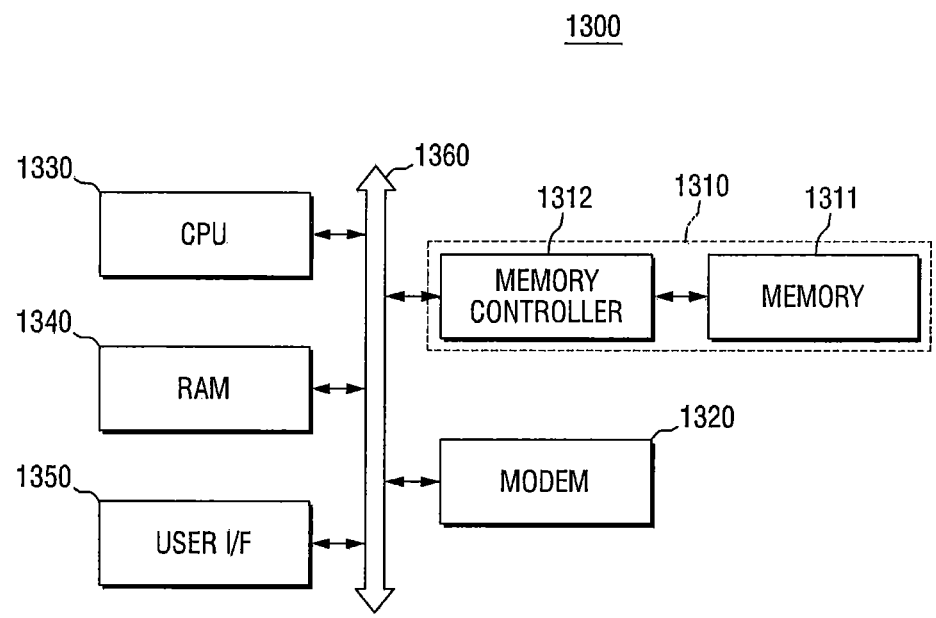
FIG. 25 is a block diagram of an information processing system using semiconductor devices according to embodiments of the present disclosure.
Figure 26:
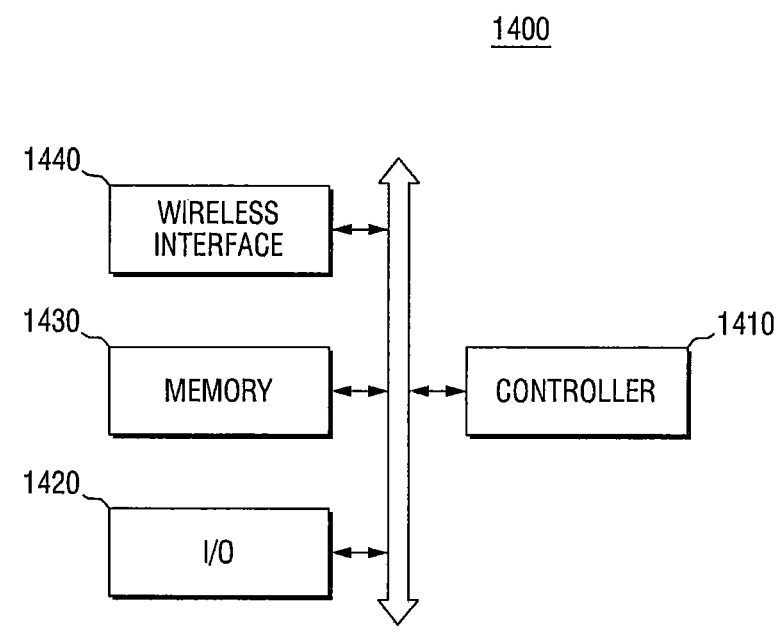
FIG. 26 is a block diagram of an electronic device including semiconductor devices according to embodiments of the present disclosure.

FIGS. 24 through 26 illustrate various products that can be manufactured using semiconductor devices according to embodiments of the present disclosure. Examples of products that can be manufactured using semiconductor devices according to embodiments of the present disclosure are not limited to the products illustrated in FIGS. 24 through 26.

FIG. 24 is a block diagram of a memory card 1200 including semiconductor devices according to embodiments of the present disclosure.

Referring to FIG. 24, a memory 1210 including semiconductor devices fabricated according to various embodiments of the present disclosure may be employed in the memory card 1200. The memory card 1200 may include a memory controller 1220, which controls data exchange between a host 1230 and the memory 1210. A static random access memory (SRAM) 1221 may be used as a working memory of a central processing unit (CPU) 1222. A host interface 1223 may include a protocol used by the host 1230 to access the memory card 1200 and exchange data with the memory card 1200. An error correction code (ECC) 1224 may detect and correct errors included in data read from the memory 1210. A memory interface 1225 may interface with the memory 1210. The CPU 1222 may perform the overall control operation for data exchange of the memory controller 1220.

FIG. 25 is a block diagram of an information processing system 1300 using semiconductor devices according to embodiments of the present disclosure.

Referring to FIG. 25, the information processing system 1300 may include a memory system 1310 including semiconductor devices fabricated according to various embodiments of the present disclosure. The information processing system 1300 may include the memory system 1310, a modem 1320, a CPU 1330, a random access memory (RAM) 1340, and a user interface 1350, which are electrically connected to a system bus 1360. The memory system 1310 may include a memory 1311 and a memory controller 1312 and may have substantially the same configuration as the memory card 1200 of FIG. 24. Data processed by the CPU 1330 or data received from an external device may be stored in the memory system 1310. The information processing system 1300 can be applied to a memory card, a solid-state drive (SSD), a camera image sensor and/or various other chipsets. For example, the memory system 1310 may be configured to employ an SSD. In this case, the information processing system 1300 can process large-volume data in a stable and reliable manner.

FIG. 26 is a block diagram of an electronic device 1400 including semiconductor devices according to embodiments of the present disclosure.

Referring to FIG. 26, the electronic device 1400 may include semiconductor devices fabricated according to various embodiments of the present disclosure. The electronic device 1400 can be used in wireless communication devices (such as personal data assistants (PDAs), notebook computers, portable computers, web tablets, wireless phones, and/or wireless digital music players) or in various devices that exchange information in a wireless communication environment.

The electronic device 1400 may include a controller 1410, an input/output (I/O) device 1420, a memory 1430, and a wireless interface 1440. The memory 1430 may include semiconductor devices fabricated according to various embodiments of the present disclosure. The controller 1410 may include a microprocessor, a digital signal processor, or the like. The memory 1430 may store commands (or user data) processed by the controller 1410. The wireless interface 1440 may be used to exchange data over a wireless communication network. The wireless interface 1440 may include an antenna and/or a wireless transceiver. The electronic device 1400 may use a third-generation communication system protocol such as Code Division Multiple Access (CDMA), Global System for Mobile communication (GSM), North 20 American Digital Cellular (NADC), Enhanced-Time Division Multiple Access (E-TDMA), Wideband CDMA (WCDMA), and/or CDMA-2000.

While the present disclosure has been particularly shown and described with reference to example embodiments thereof, it will be understood by those of ordinary skill in the art that various changes in form and detail may be made therein without departing from the spirit and scope of the present disclosure as defined by the following claims. The example embodiments should be considered in a descriptive sense only and not for purposes of limitation.

What is claimed is:

1. A semiconductor device comprising:
   a fin comprising long sides that extend along a first direction and a first short side that extends along a second direction, wherein the first short side is short relative to the long sides;
   a first trench that extends along the second direction that is immediately adjacent the first short side of the fin and has a first depth;
   a second trench that extends along the second direction that is immediately adjacent the first trench and has a second depth that is greater than the first depth;
   a first protrusion structure that has a maximum height and that protrudes from a bottom of the first trench and extends side by side with the first short side of the fin;
   a gate that is formed on the first protrusion structure to extend side by side with the first short side of the fin; and
   a field insulating layer in the first trench and the second trench, wherein the height of the first protrusion structure is below an upper surface of the field insulation layer,
   wherein the gate overlaps the first protrusion structure, and part of the gate directly contacts the upper surface of the field insulating layer.

2. The semiconductor device of claim 1, wherein the first protrusion structure is located at a boundary between the first trench and the second trench.

3. The semiconductor device of claim 2, wherein the first protrusion structure comprises a first inclined surface that is on a side of the first trench and a second inclined surface that is on a side of the second trench, wherein the first inclined surface has a first angle of inclination, and the second inclined surface has a second angle of inclination that is different from the first angle of inclination.

4. The semiconductor device of claim 1, wherein the second trench defines an active region,
wherein the first short side of the fin is connected to one of the long sides of the fin,
wherein the fin further comprises a second short side that extends along the second direction, wherein the second short side is short relative to the long sides, and wherein the second short side of the fin is connected to one of the long sides of the fin, and
wherein the semiconductor device further comprises:
a third trench extending along the second direction that is immediately adjacent the second short side of the fin and has a third depth;
a fourth trench extending along the second direction that is immediately adjacent the third trench and has a fourth depth greater than the third depth; and
a second protrusion structure that defines a sidewall of the third trench.

5. The semiconductor device of claim 4, wherein the second protrusion structure has a height that is different than the height of the first protrusion structure.

6. The semiconductor device of claim 1, further comprising:
a third trench that extends along the first direction that is immediately adjacent a first long side of the fin and has a third depth, wherein the third trench comprises a second protrusion structure that defines a sidewall of the third trench, that extends along the first direction, and that has a second height extending above a bottom of the third trench; and
a fourth trench that extends along the first direction immediately adjacent a second long side of the fin and has a fourth depth, wherein the fourth trench comprises a third protrusion structure that defines a sidewall of the fourth trench, that extends along the first direction, and that has a third height extending above a bottom of the fourth trench,
wherein the third trench that extends along the first direction and the fourth trench that extends along the first direction each intersect with the first trench that extends along the first short side of the fin, and wherein the second depth of the second trench which extends along the second direction is greater than the third depth of the third trench that extends along the first long side and the fourth depth of the fourth trench that extends along the second long side.

7. A semiconductor device comprising:
a first fin, wherein the first fin comprises long sides extending along a first direction and a first short side extending along a second direction, wherein the first short side of the first fin is short relative to the long sides of the first fin and wherein the first fin is in a first active region;
a second fin, wherein the second fin comprises long sides extending in the first direction and a second short side extending along the second direction, wherein the second short side of the second fin is short relative to the long sides of the second fin and wherein the second fin is in a second active region;
a first trench extending in the second direction having a first depth, that defines and separates the first active region and the second active region from each other;
a second trench extending along the second direction having a second depth that is less than the first depth, that is immediately adjacent the first short side of the first fin;
a third trench, having a third depth that is less than the first depth, that is immediately adjacent the second short side of the second fin;
a first protrusion structure that protrudes from a bottom of the second trench;
a second protrusion structure that protrudes from a bottom of the third trench;
a first gate on the first protrusion structure and that extends side by side with the first short side of the first fin; and
a second gate on the second protrusion structure and that extends side by side with the second short side of the second fin.

8. The semiconductor device of claim 7, wherein the first short side of the first fin and the second short side of the second fin face each other.

9. The semiconductor device of claim 7, wherein the first protrusion structure is located at a boundary between the first trench and the second trench, and the second protrusion structure is located at a boundary between the first trench and the third trench.

10. The semiconductor device of claim 9, further comprising a third gate on the first trench between the first gate and the second gate,
wherein the first through third gates extend side by side with each other.

11. The semiconductor device of claim 7, wherein a height of the first protrusion structure is different from a height of the second protrusion structure.

12. The semiconductor device of claim 7, wherein the first protrusion structure comprises a first inclined surface on a side of the first trench and a second inclined surface on a side of the second trench, wherein the first inclined surface has a first angle of inclination, and the second inclined surface has a second angle of inclination that is different from the first angle of inclination.

13. A semiconductor device comprising:
a first fin, wherein the first fin comprises long sides extending along a first direction and a first short side extending along a second direction, wherein the first short side of the first fin is short relative to the long sides of the first fin and wherein the first fin is in a first active region;
a second fin, wherein the second fin comprises long sides extending in the first direction and a second short side extending along the second direction, wherein the second short side of the second fin is short relative to the long sides of the second fin and wherein the second fin is in a second active region;
a first trench extending along the second direction having a first depth, that defines and separates the first active region and the second active region from each other;
a second trench extending along the second direction having a second depth that is less than the first depth, that is immediately adjacent the first short side of the first fin;
a protrusion structure that protrudes from a bottom of the second trench;
a first gate on the protrusion structure and that extends side by side with the first short side of the first fin; and
a second gate on the second fin and that extends side by side with the second short side of the second fin.

14. The semiconductor device of claim 13, wherein the first short side of the first fin and the second short side of the second fin face each other.

15. The semiconductor device of claim 13, wherein the protrusion structure is located at a boundary between the first trench and the second trench.

16. The semiconductor device of claim 13, wherein the first and second gates extend side by side with each other.

17. The semiconductor device of claim 13, wherein the protrusion structure comprises a first inclined surface on a side of the first trench and a second inclined surface on a side of the second trench, wherein the first inclined surface has a first angle of inclination, and the second inclined surface has a second angle of inclination that is different from the first angle of inclination.

18. The semiconductor device of claim 13, further comprising a third trench that is immediately adjacent a first short side of the second fin and has a third depth that is less than the first depth, wherein a boundary between the first trench and the third trench is substantially without a protrusion structure.

* * * * *